United States Patent [19]
Lee et al.

[11] Patent Number: 6,057,246
[45] Date of Patent: May 2, 2000

[54] METHOD FOR ETCHING A METAL LAYER WITH DIMENSIONAL CONTROL

[75] Inventors: I-Ping Lee, Taoyuan; Erik S. Jeng, Hsinchu; Chyei-Jer Hsieh, Tainan, all of Taiwan

[73] Assignee: Vanguard International Semiconductor Corporation, Taiwan

[21] Appl. No.: 09/067,927

[22] Filed: Apr. 28, 1998

[51] Int. Cl.⁷ .............................................. H01L 21/3065
[52] U.S. Cl. ...................... 438/712; 438/720; 438/724; 438/739
[58] Field of Search .................... 438/712, 713, 438/720, 724, 739

[56] References Cited

U.S. PATENT DOCUMENTS

| | | |
|---|---|---|
| 4,915,779 | 4/1990 | Srodes et al. . |
| 5,126,289 | 6/1992 | Ziger . |
| 5,302,933 | 4/1994 | Kudo et al. ................................ 338/18 |
| 5,369,053 | 11/1994 | Fang . |
| 5,449,639 | 9/1995 | Wei et al. . |
| 5,618,383 | 4/1997 | Randall . |
| 5,644,086 | 7/1997 | Cahill et al. ............................... 73/654 |
| 5,679,606 | 10/1997 | Wang et al. . |
| 5,858,870 | 1/1999 | Zheng et al. ............................. 438/622 |
| 5,858,879 | 1/1999 | Chao et al. ............................... 438/725 |

*Primary Examiner*—Terrel Morris
*Assistant Examiner*—Cheryl Juska
*Attorney, Agent, or Firm*—Christensen O'Connor Johnson Kindness PLLC

[57] ABSTRACT

A method for etching a metal layer on a substrate with dimensional control is disclosed. First, an anti-reflection layer is formed over the metal layer. A photoresist layer is then formed over the anti-reflection layer. A metal layer pattern is defined by patterning the photoresist layer. An etching process is performed to etch the anti-reflection layer with dimensional loss compared with the metal layer pattern, by using the photoresist layer as a mask. Another etching process is performed to etch the metal layer with dimensional gain compared with the anti-reflection layer, by using the anti-reflection layer as a mask. A metal layer with nearly zero-biased dimension is achieved.

15 Claims, 2 Drawing Sheets

METHOD FOR ETCHING A METAL LAYER WITH DIMENSIONAL CONTROL

FIELD OF THE INVENTION

The present invention relates to semiconductor fabrication processes, and more specifically, to a method for etching metal layers with precise dimensional control.

BACKGROUND OF THE INVENTION

The trend in integrated circuits (IC) is to form smaller chips that perform sophisticated functions with high speed. This leads to improvements in computer, communication, and consumer electronics equipment. The devices in the ICs are shrunk down to the deep submicron range in ultra large scale integration (ULSI) technology. Accordingly, the number of devices on a single chip has been increased from a thousand to nearly a billion.

One of the most difficult challenges in fabricating ever shrinking devices is to accurately control the size of various features in the devices. Further, this must be done in a cost effective manner. Accurately controlling feature size is critical in the manufacture of submicron size devices. A dimensional deviation of one hundred angstroms, which may be tolerable in early semiconductor fabrication processes, can cause serious failure in submicron IC's.

The lithography and etching processes are some of the most important processes in defining individual functional regions and determining the feature size of devices. I-line and deep-ultraviolet technology has been used for years for high definition lithography. RIE (reactive ion etching) and MERIE (magnetically enhanced reactive ion etching) are also widely used for achieving better anisotropy.

However, most etching processes have dimensional deviation from the ideal dimension defined on the mask pattern. An after-etched layer for most metal layers has been observed to have a larger dimension than a pattern defined on the covering mask. The problem is typically referred to as the CD (critical dimension) gain of metal etching.

The metal layers are of great importance in forming contacts and interconnections. In a metallization process, a metal layer is formed over a semiconductor. A photoresist layer is formed and patterned to define the pattern of the connective paths. The metal layer is then etched by the pattern defined on the photoresist layer to form the designed connection network. A dielectric layer is then deposited to insulate between individual paths and also between subsequent layers.

However, the problem of the undesired CD gain on the conductors increases the difficulty in depositing dielectric between the conductors. The reliability of the circuit is reduced and the possibility of residue leakage is increased.

There have been some prior art approaches for achieving metal etching with zero bias of the patterned dimension. Techniques such as side-etching or over-etching have been proposed. However, each of these techniques has drawbacks such as lower photoresist selectivity, over-etching from the sides, and residues.

What is needed is a method for solving the CD gain problem in metal etching to provide an etching process with precise dimension control.

SUMMARY OF THE INVENTION

A method for etching a metal layer on a substrate is disclosed in the present invention. The method comprising the steps of: forming an anti-reflection layer over said metal layer; forming a photoresist layer over said anti-reflection layer; defining a metal layer pattern in said photoresist layer; etching said anti-reflection layer with dimensional loss compared with said metal layer pattern, by using said photoresist layer as a mask; and etching said metal layer with dimensional gain compared with said anti-reflection layer, by using said anti-reflection layer as a mask.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention discloses a method for etching with precise dimensional control. In particular, a method for etching a metal layer with precise dimension duplication of the defined pattern is illustrated. The CD (critical dimension) of the metal layer can be controlled more accurately and the undesired CD gain in conventional etching can be eliminated. A nearly zero bias in dimension can be achieved with minimal effort by the in-situ etching steps within one chamber.

Without limiting the scope and the spirit of the present invention, a detailed embodiment of applying the etching method of the present invention to one metal layer is described in detail. The method for controlling the dimension of metal etching can be applied in patterning the metal layers in a multi-layer metallization process. Upon acknowledging the disclosed method, a person skilled in the art can apply the method of the present invention in different applications of patterning metal layers. The variations are well known in the art and thus are not illustrated in detail.

Figure 1:
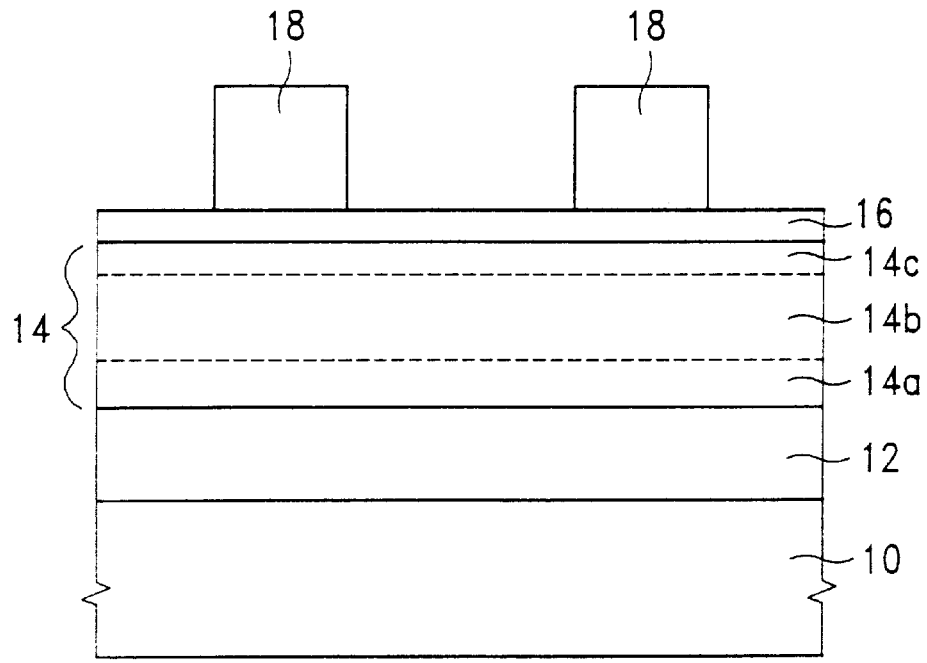
FIG. 1 illustrates a cross sectional view of forming a metal layer, an anti-reflection layer, and a photoresist layer on a semiconductor substrate in accordance with the present invention.

Turning to FIG. 1, a semiconductor substrate 10 is provided for forming connections. It can be appreciated that although substrate 10 is used as an example, the substrate 10 may be substituted therefor by a dielectric layer when the metal layer is to be fabricated several layers above the substrate. Thus, the term substrate 10 should not only mean a silicon substrate, but also any material that serves as a base for the metal layer.

In this example, a silicon substrate with a crystalline direction of <100> is used as the substrate 10. Other kinds of substrate with different crystalline directions and materials can also be used. Typically, the substrate 10 is provided with functional regions and devices such as MOS (metal oxide semiconductor) transistors, BJTs (bipolar junction transistors), or capacitors. A dielectric layer 12 is formed thereon to insulate between contact plugs and layers.

For a focused illustration of the invention, only the substrate 10 and the dielectric layer 12 is shown in FIG. 1.

If the substrate 10 is provided for forming the second or later layer of connections, the dielectric layer 12 may contain other underlying layers of the connection network in the metallization structure. In the application for forming direct contacts to the regions on the substrate 10, the dielectric layer 12 may contain contact windows or contact holes.

First, a metal layer 14 is formed over the dielectric layer 12. In most applications, the metal layer 14 is a combination of conductive layers. In the preferred embodiment, a combination of three layers is employed. The first layer is a barrier layer 14a over the substrate 10. The barrier layer 14a is used to keep a second layer 14b from being in direct contact with an underlying surface like silicon or polysilicon. The spiking effect can be prevented and an ohmic contact can be formed. The barrier layer 14a can be a titanium layer or a titanium nitride layer. The titanium layer or the titanium nitride layer can be formed by a sputtering process like DC sputtering or magnetron DC sputtering. A reactive sputtering deposition can also be used for forming the titanium nitride layer.

The second layer 14b can be an aluminum-copper alloy layer which is also formed with a DC sputtering or a magnetron DC sputtering process. The third layer 14c can also be a titanium layer or a titanium nitride layer which is formed by DC sputtering, magnetron DC sputtering, or reactive sputtering deposition.

Next, an anti-reflection layer 16 is formed over the metal layer 14. The use of the anti-reflection layer 16 is of vital importance in a lithography process using short-wavelength light sources like i-line or deep-ultraviolet sources. By shielding the metal layer 14 with the anti-reflection layer 16, the light reflection from the metal layer 14 during exposure can be reduced. The accuracy of the lithography is then enhanced. In this case, an oxynitride layer formed by CVD (chemical vapor deposition) is used as the anti-reflection layer 16.

A photoresist layer 18 is formed over the anti-reflection layer 16. A desired metal layer pattern is then defined in the photoresist layer 18, to form the structure shown in FIG. 1. The undefined regions on the photoresist layer 18 are removed during the process of developing the photoresist.

Figure 2:
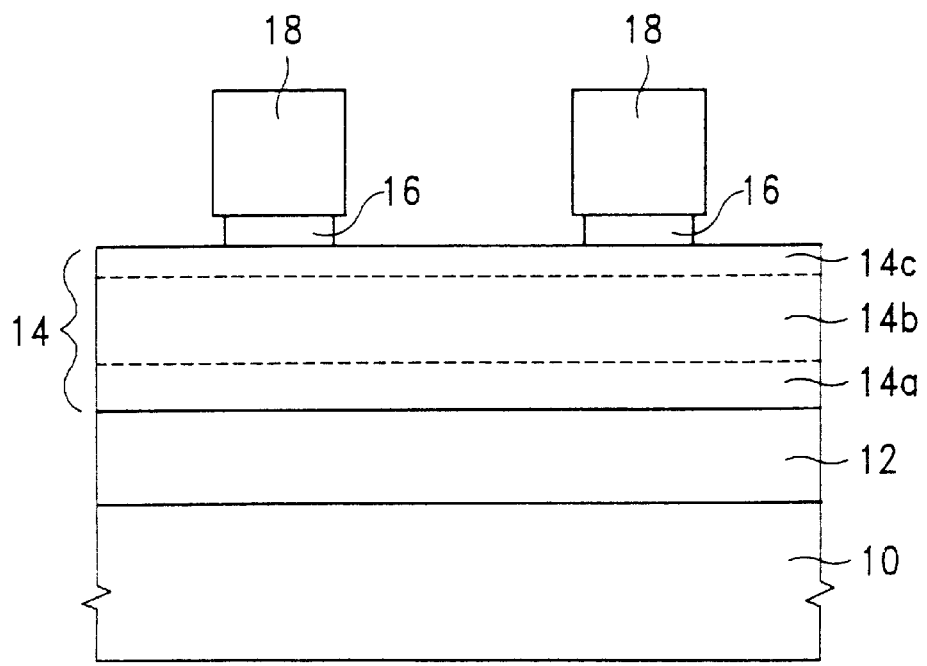
FIG. 2 illustrates a cross sectional view of etching the anti-reflection layer with dimensional loss compared with the metal layer pattern in accordance with the present invention.

Turning to FIG. 2, the anti-reflection layer 16 is then etched by using the photoresist layer 18 as a mask. The anti-reflection layer 16 is etched with dimensional loss compared with the metal layer pattern on the photoresist layer 18. Thus, a narrower width of the anti-reflection layer 16 then the photoresist layer 18 is illustrated in FIG. 2. The dimensional loss can be adjusted with a proper selection of etching reactants. A RIE (reactive ion etching) or a MERIE (magnetically enhanced reactive etching) can be used to perform the etching. In the preferred embodiment, the pressure of the etching chamber is controlled at about 6–12 millitorr. The gas chemistry of reactants includes about 60% to about 100% of $CHF_3$. Other optionally additive gases like $SF_6$, $CF_4$, and $BCl_3$ can also be supplied. The total gas flow rate is about 50 sccm to about 100 sccm.

Figure 3:
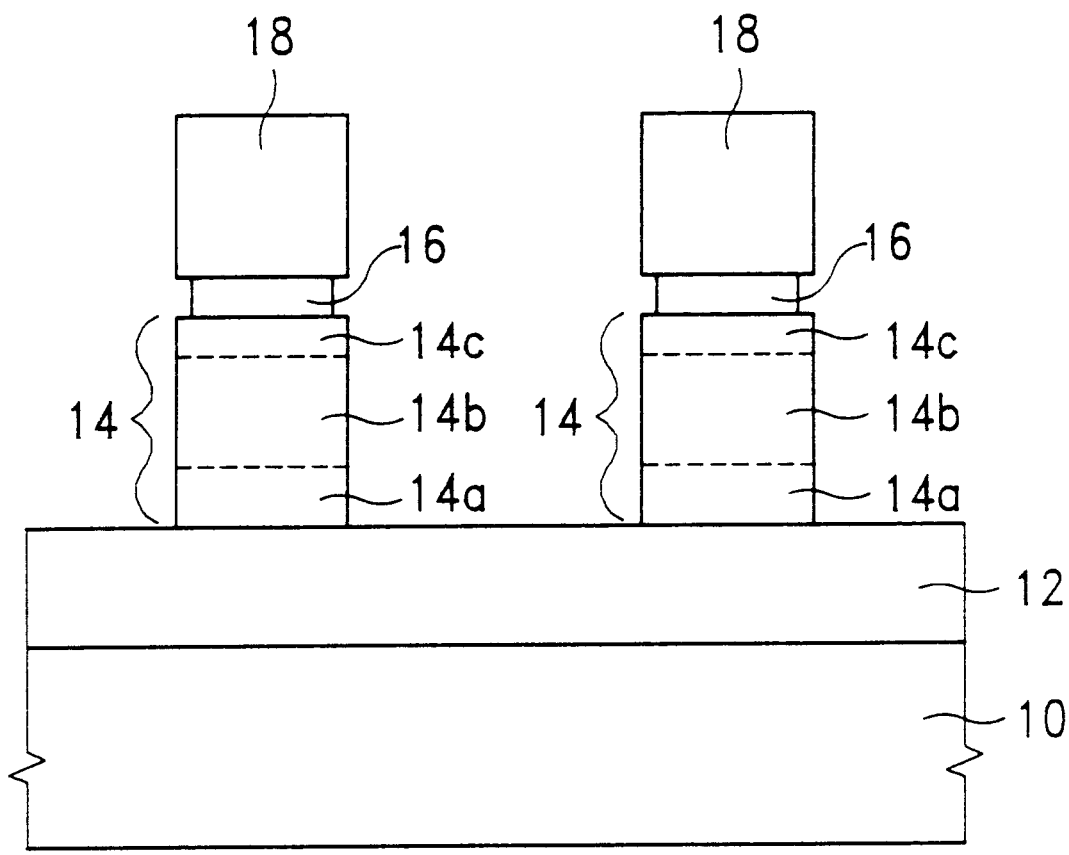
FIG. 3 illustrates a cross sectional view of etching the metal layer with dimensional gain compared with the anti-reflection layer in accordance with the present invention.

Next, the metal layer 14 is etched using the anti-reflection layer 16 as a mask, as shown in FIG. 3. With the dimensional gain present with most metal etching processes, a dimensional gain of the metal layer 14 is found in comparing with the anti-reflection layer 16. By compensating the dimensional gain of the metal layer 14 with the dimensional loss of the anti-reflection layer 16, a nearly zero-biased dimension of the metal layer 14 can be reached. By selecting the etchants and controlling the process, the width of the metal layer 14 is etched to the width of the defined metal layer pattern. Thus, the problem of the undesired dimensional gain (or CD gain) on the designed connections can be eliminated and the difficulty of filling dielectric material is erased.

It should be noted that the etching of the metal layer 14 and of the anti-reflection coating 16 are in-situ etching steps which are performed in the same chamber. Thus, the effort in loading and unloading wafers is minimized.

For the etching of the metal layer 14, a RIE or a MERIE can be used. The pressure of the etching chamber is controlled at about 6–20 millitorr. The gas chemistry of reactants includes about 20% to about 80% of $Cl_2$ and about 80% to about 20% of $BCl_3$. Other additive gases like Ar, $N_2$, $CHF_3$, and $CH_4$ can also be supplied optionally. The total gas flowing rate is about 100 sccm to about 200 sccm.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for etching a metal layer on a substrate, said method comprising the steps of:

forming an anti-reflection layer over said metal layer;

forming a photoresist layer over said anti-reflection layer;

defining a metal layer pattern in said photoresist layer;

etching said anti-reflection layer with dimensional loss compared with said metal layer pattern by using said photoresist layer as a mask, said anti-reflection layer etching step being performed with a first reactive ion etch (RIE) having a gas chemistry comprising $CHF_3$ and at a pressure of about 6–12 millitorr; and etching said metal layer with dimensional gain compared with said anti-reflection layer, by using said anti-reflection layer as a mask.

2. The method of claim 1, wherein said metal layer comprises a barrier layer over said substrate, an aluminum-copper alloy layer over said barrier layer, and a titanium layer or a titanium nitride layer over said aluminum-copper alloy layer.

3. The method of claim 1, wherein said barrier layer is selected from titanium, titanium nitride, or a combination thereof.

4. The method of claim 1, wherein said anti-reflection layer is an oxynitride layer.

5. The method of claim 1, wherein said step of etching said anti-reflection layer and said step of etching said metal layer are performed in the same etching chamber.

6. The method of claim 1, wherein said gas chemistry further comprises $SF_6$, $CF_4$, or $BCl_3$.

7. The method of claim 1, wherein said step of etching said metal layer is performed with a second RIE with a gas chemistry comprising $Cl_2$ and $BCl_3$.

8. The method of claim 7, wherein said second RIE is performed at a pressure of about 6–20 millitorr.

9. The method of claim 7, wherein said gas chemistry further comprises Ar, $N_2$, $CHF_3$, or $CH_4$.

10. A method for etching a metal layer on a substrate, said metal layer comprising a barrier layer over said substrate, an aluminum-copper alloy layer over said barrier layer, and a titanium layer or a titanium nitride layer over said aluminum-copper alloy layer, said method comprising the steps of:

forming an anti-reflection layer over said metal layer, said anti-reflection layer being an oxynitride layer;

forming a photoresist layer over said anti-reflection layer;

defining a metal layer pattern in said photoresist layer;

etching said anti-reflection layer by using said photoresist layer as a mask, with a first RIE by a gas chemistry comprising $CHF_3$, said anti-reflection layer being etched with dimensional loss compared with said metal layer pattern, said first RIE being performed at a pressure of about 6–12 millitorr; and etching said metal layer by using said anti-reflection layer as a mask, with a second RIE by gas chemistry comprising $Cl_2$ and $BCl_3$, said metal layer being etched with dimensional gain compared with said anti-reflection layer.

11. The method of claim 10, wherein said barrier layer is selected from titanium, titanium nitride, or a combination thereof.

12. The method of claim 10, wherein said step of etching said anti-reflection layer and said step of etching said metal layer are performed in the same etching chamber.

13. The method of claim 10, wherein said gas chemistry of said first RIE further comprises $SF_6$, $CF_4$, or $BCl_3$.

14. The method of claim 10, wherein said second RIE is performed at a pressure of about 6–20 millitorr.

15. The method of claim 10, wherein said gas chemistry of said second RIE further comprises Ar, $N_2$, $CHF_3$, or $CH_4$.

* * * * *